(12) United States Patent
Choi et al.

(10) Patent No.: US 12,242,290 B2
(45) Date of Patent: Mar. 4, 2025

(54) INTEGRATING VOLTAGE REGULATORS AND PASSIVE CIRCUIT ELEMENTS WITH TOP SIDE POWER PLANES IN STACKED DIE ARCHITECTURES

(71) Applicant: Intel Corporation, Santa Clara, CA (US)

(72) Inventors: Beomseok Choi, Chandler, AZ (US); William J. Lambert, Tempe, AZ (US); Krishna Bharath, Phoenix, AZ (US); Kaladhar Radhakrishnan, Chandler, AZ (US); Adel Elsherbini, Chandler, AZ (US); Henning Braunisch, Phoenix, AZ (US); Stephen Morein, San Jose, CA (US); Aleksandar Aleksov, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 17/484,286

(22) Filed: Sep. 24, 2021

(65) Prior Publication Data
US 2023/0095063 A1  Mar. 30, 2023

(51) Int. Cl.
*G05F 1/44* (2006.01)
*H01L 23/50* (2006.01)
*H01L 25/065* (2023.01)

(52) U.S. Cl.
CPC .............. *G05F 1/44* (2013.01); *H01L 23/50* (2013.01); *H01L 25/0657* (2013.01)

(58) Field of Classification Search
CPC ....... G05F 1/44; H01L 23/50; H01L 25/0657; H01L 23/645
See application file for complete search history.

(56) References Cited

U.S. PATENT DOCUMENTS

| 9,406,648 B2 * | 8/2016 | Wang ...................... H01L 24/18 |
| 2019/0385977 A1 * | 12/2019 | Elsherbini ............... H01L 24/17 |
| 2020/0235082 A1 | 7/2020 | Eid et al. |

OTHER PUBLICATIONS

"Cold Spraying;" Wikipedia, as accessed Oct. 28, 2021 at https://en.wikipedia.org/wiki/Cold_spraying, 6 pages.

* cited by examiner

*Primary Examiner* — Adolf D Berhane
*Assistant Examiner* — Afework S Demisse
(74) *Attorney, Agent, or Firm* — Alliance IP, LLC

(57) ABSTRACT

In one embodiment, an apparatus includes a first die with voltage regulator circuitry and a second die with logic circuitry. The apparatus further includes an inductor, a capacitor, and a conformal power delivery structure on the top side of the apparatus, where the voltage regulator circuitry is connected to the logic circuitry through the inductor, the capacitor, and the conformal power delivery structure. The conformal power delivery structure includes a first electrically conductive layer defining one or more recesses, a second electrically conductive layer at least partially within the recesses of the first electrically conductive layer and having a lower surface that generally conforms with the upper surface of the first electrically conductive layer, and a dielectric material between the surfaces of the first electrically conductive layer and the second electrically conductive layer that conform with one another.

20 Claims, 13 Drawing Sheets

INTEGRATING VOLTAGE REGULATORS AND PASSIVE CIRCUIT ELEMENTS WITH TOP SIDE POWER PLANES IN STACKED DIE ARCHITECTURES

BACKGROUND

In current stacked die architectures, low resistance power delivery is only available/possible on a die that is closest to the package. Further, most passive circuit elements (e.g., inductors and capacitors) are located on the package. Hence, the top-level dies in the architecture may need to go through one or more dies below it, e.g., through vias, to access a low resistance power plane. This issue may be exacerbated in scenarios where the top-level die needs to access the passive circuit elements and then have an additional return path back up to the top-level die.

DETAILED DESCRIPTION

Aspects of the present disclosure may include a conformal power delivery structure that includes two or more power planes formed on one another. The conformal power delivery structure may include a top/second power plane layer deposited on a lower/first power plane layer in such a way the top power plane layer conforms with the shape of the lower power plane layer. Each power plane layer may be separated by and insulated with a thin dielectric material.

In particular, aspects of the present disclosure may incorporate a conformal power delivery structure on the top side of a die and/or inside of a stacked die architecture to allow for complete voltage regulator (VR) architectures. Embodiments described herein may provide one or more advantages, including, for example, less impedance between a die and passive components in the architecture via three-dimensional placement of components. In addition, the connections between the components in an architecture may be formed with low impedance conformal power delivery structures. In addition, redundant routing to passives can be reduced when passives are inside the stacked die architectures. In certain instances, the conformal power delivery structure can provide a dedicated power plane that does not disrupt 10 connections between dies in stacked and tandem configurations. Further, the conformal power delivery structure can be formed inside the stacked die architecture layers to provide electrical and thermal conductivity benefits, as well as flexible and high performance power delivery via VR architectures. VRs as described herein are not limited to switching regulators with inductors, but may include switched capacitor and linear VRs as well.

Figure 1:
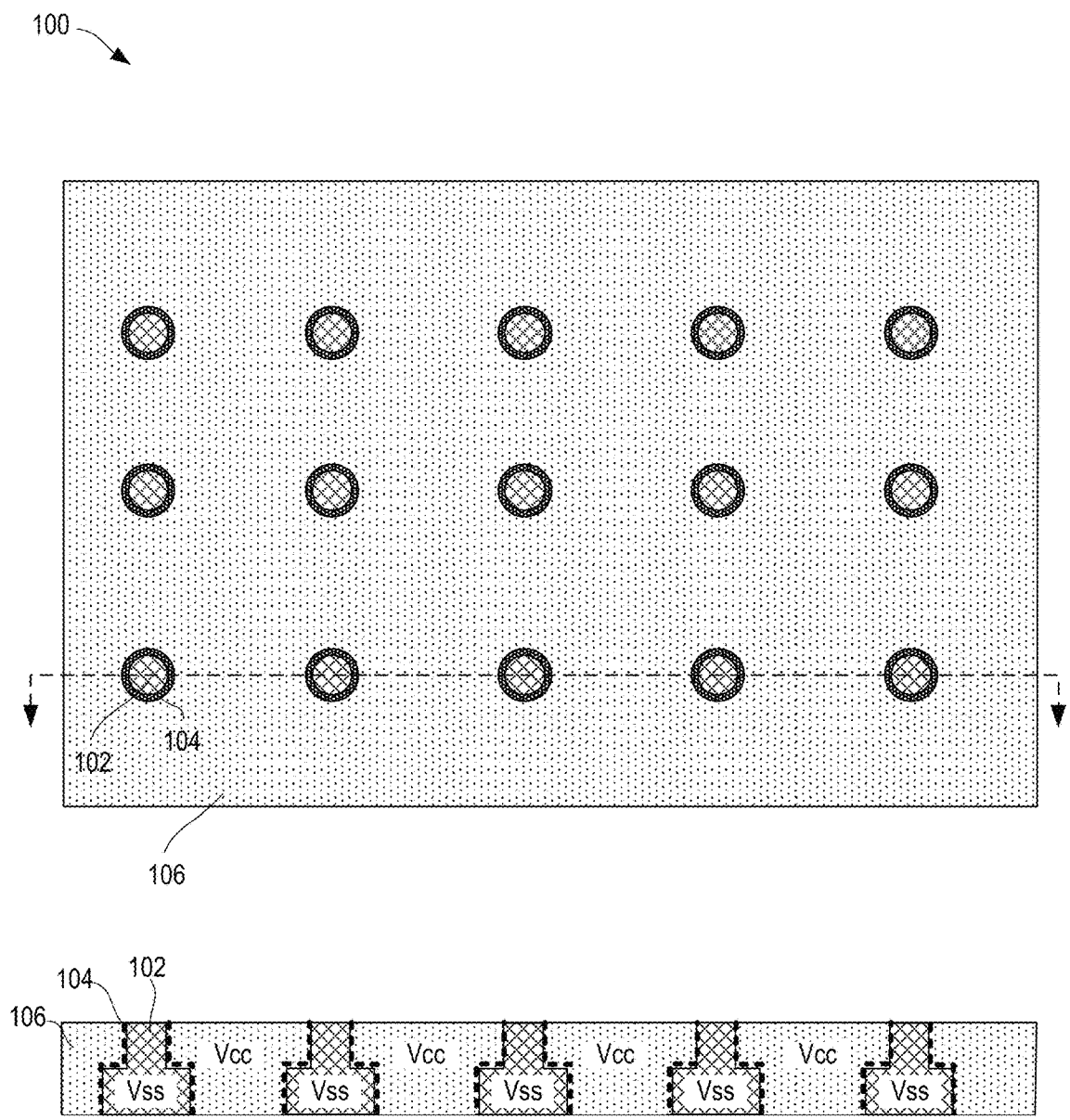
FIG. 1 illustrates an example conformal power delivery structure in accordance with embodiments of the present disclosure.

FIG. 1 illustrates an example conformal power delivery structure 100 in accordance with embodiments of the present disclosure. In particular, FIG. 1 illustrates a top view of the conformal power delivery structure 100 and a side/cross-sectional view of the conformal power delivery structure 100. The conformal power delivery structure 100 includes a first power plane 102 and second power plane 106 formed on the first power plane 102, e.g., as described above. The power planes 102, 106 are separated by a thin dielectric material layer 104. As may be seen form the top view of the conformal power delivery structure 100, the size of the anti-pad created by the thin dielectric layer 104 may be quite smaller than the anti-pads required by traditional parallel power plane structures, e.g., an order(s) of magnitude smaller, potentially providing one or more advantages, such as better electrical performance, better lateral electrical resistance, and/or improved lateral inductance.

Figure 4:
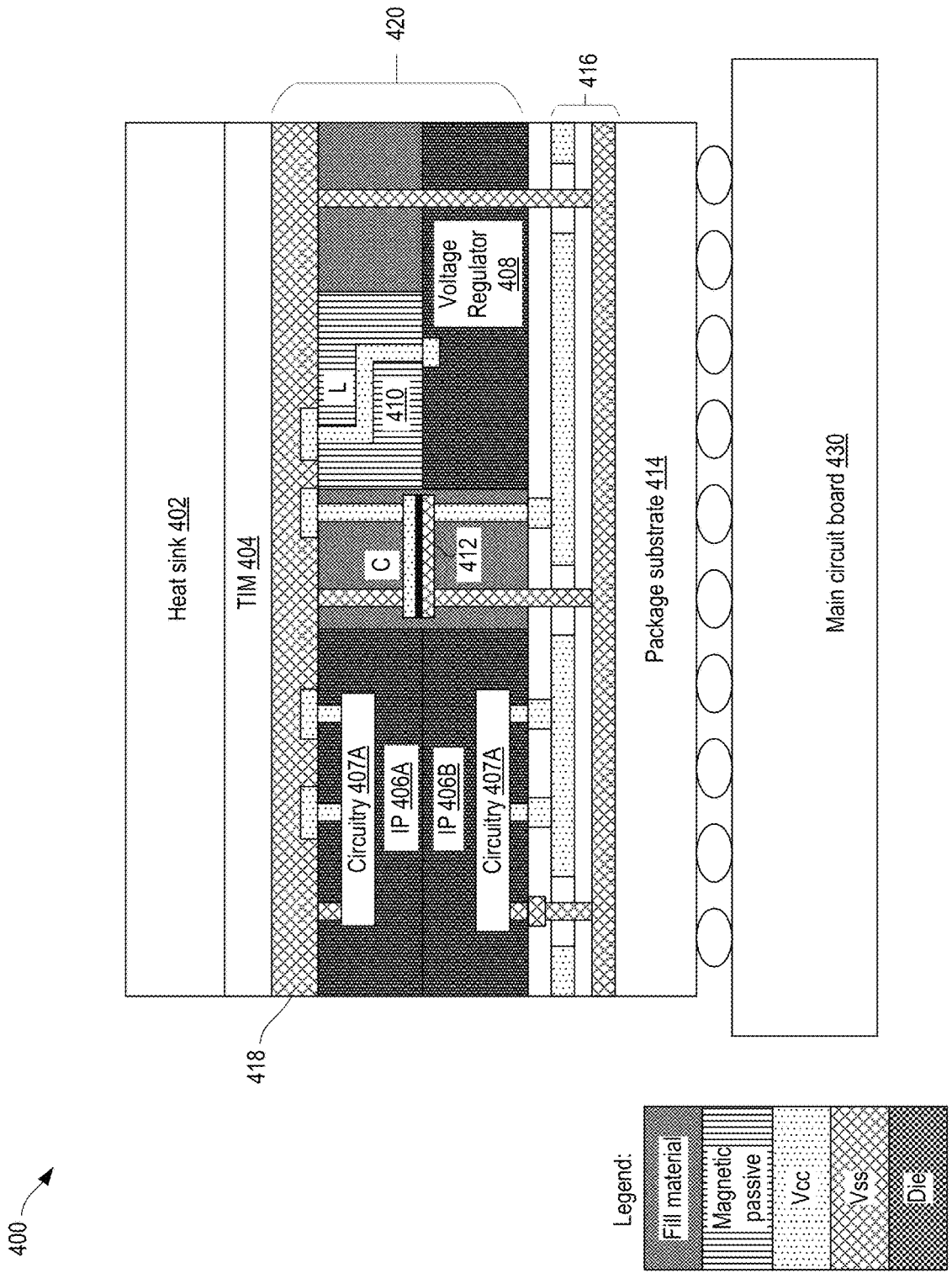
FIG. 4 illustrates an example system that includes a conformal power delivery structure on the backside of a stacked die architecture in accordance with embodiments of the present disclosure.

Although sometimes described herein as being power "planes", it will be understood that the power planes of the present disclosure may not be planar in the geometric sense (e.g., completely flat in one plane like traditional power planes). In addition, although shown as formed in a particular way (e.g., with two power planes), the conformal power delivery structure 100 may be formed in any suitable manner (e.g., with three or more power planes, or with different via shapes, or no vias, or with different structures). As one example, the conformal power delivery structure 100 may be used to distribute power on the backside of a die, or a die stack as shown in FIG. 4.

As used herein, a first surface generally conforming to a second surface may refer to the first surface having the same or very similar shape as the first surface, with the first surface following along the surface of the second surface. For instance, in the example shown in FIG. 1, the lower surface of the plane 106 (the surface facing the plane 102) has the same shape as the upper surface of the plane 102 (the surface facing the plane 106). Thus, the dielectric layer 104 between the planes 102, 106 has the same shape as the upper surface of plane 102 and lower surface of plane 106.

However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 106 generally follows along with the surface of the upper surface of the lower plane 102 (and/or the dielectric layer 104 to the extent it's shape is slightly different from that of the upper surface of the plane 102).

As used herein, the terms "upper"/"lower" or "above"/ "below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

Figure 2:
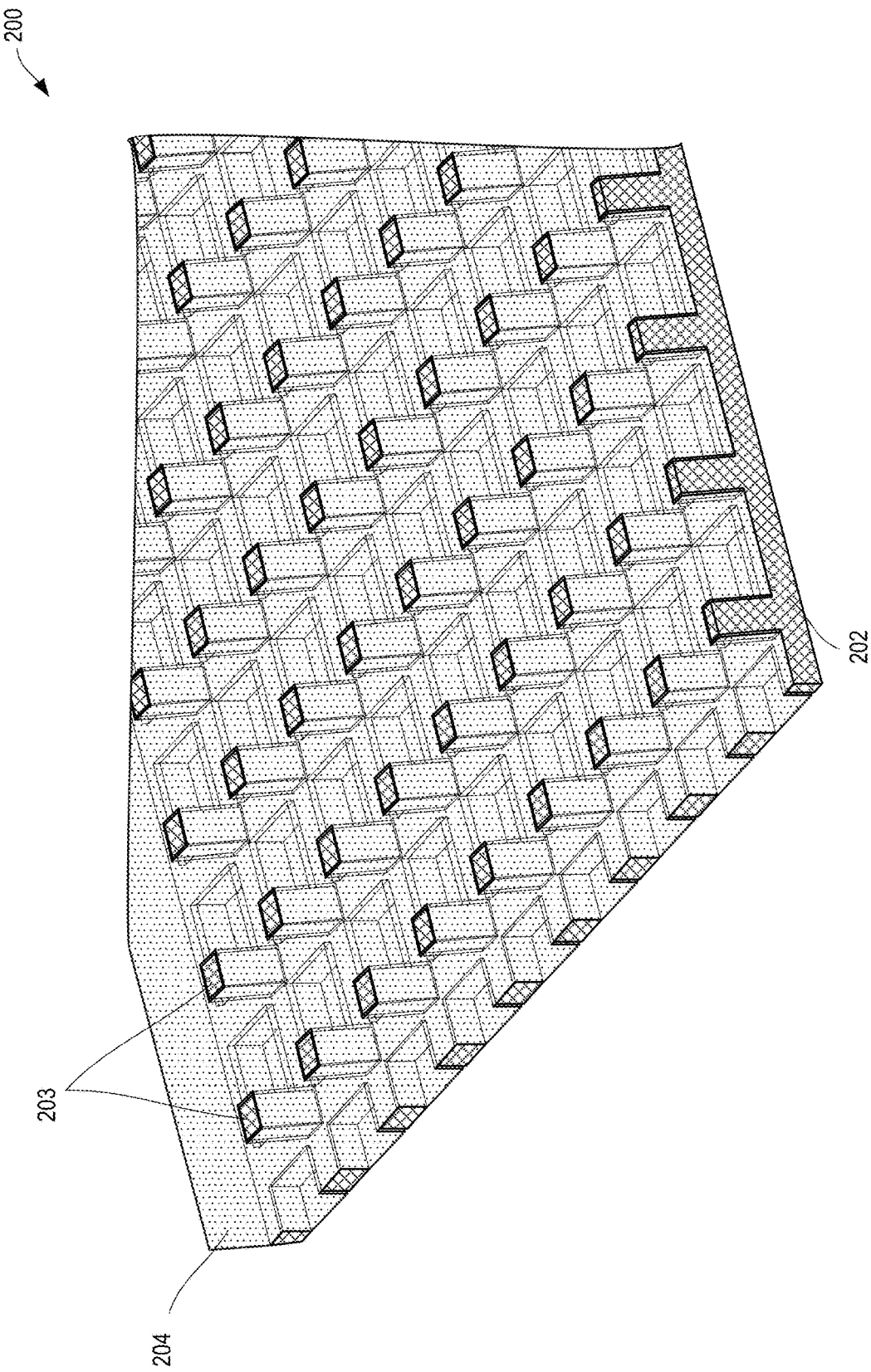
FIGS. 2 and 3 illustrate perspective views of example conformal power delivery structures in accordance with embodiments of the present disclosure
Figure 3:
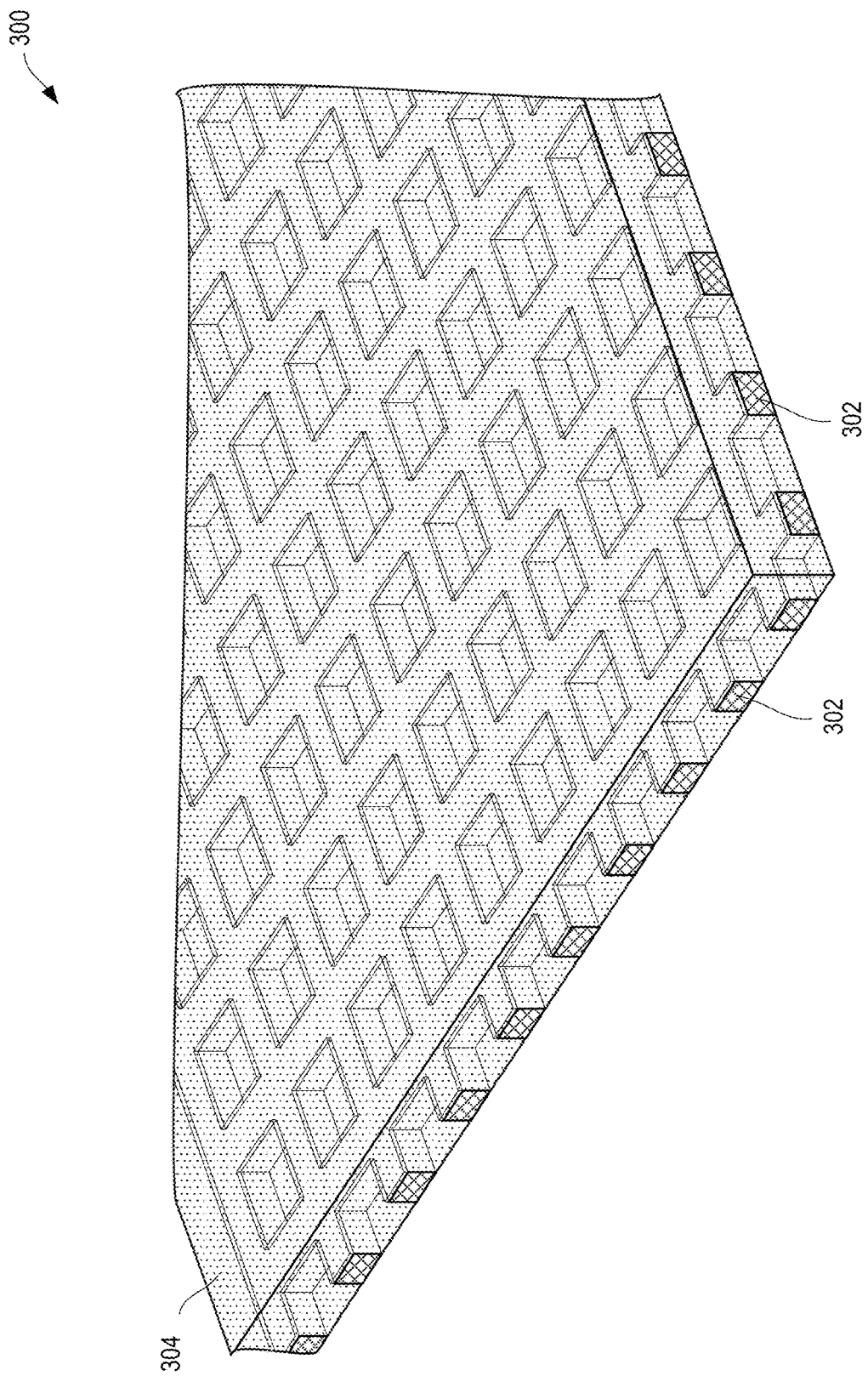

FIGS. 2 and 3 illustrate perspective views of example conformal power delivery structures in accordance with embodiments of the present disclosure. In the example shown in FIG. 2, the conformal power delivery structure 200 includes a bottom power plane 202 and top power plane 206 separated by a dielectric layer. The conformal power delivery structure 200 also includes a number of protrusions/ through connections 203 to allow the bottom power plane 202 to connect to a device that may be placed on the top surface of the top power plane 204 (e.g., a die, package substrate, or any other suitable connecting device or apparatus). In the example shown in FIG. 3, the conformal power delivery structure 300 includes a bottom power plane 302 and top power plane 306 separated by a dielectric layer. However, in the example shown in FIG. 3, there are no through connections going from the bottom power plane 302 to the top surface of the top power plane 304 as in FIG. 2.

Figure 7:
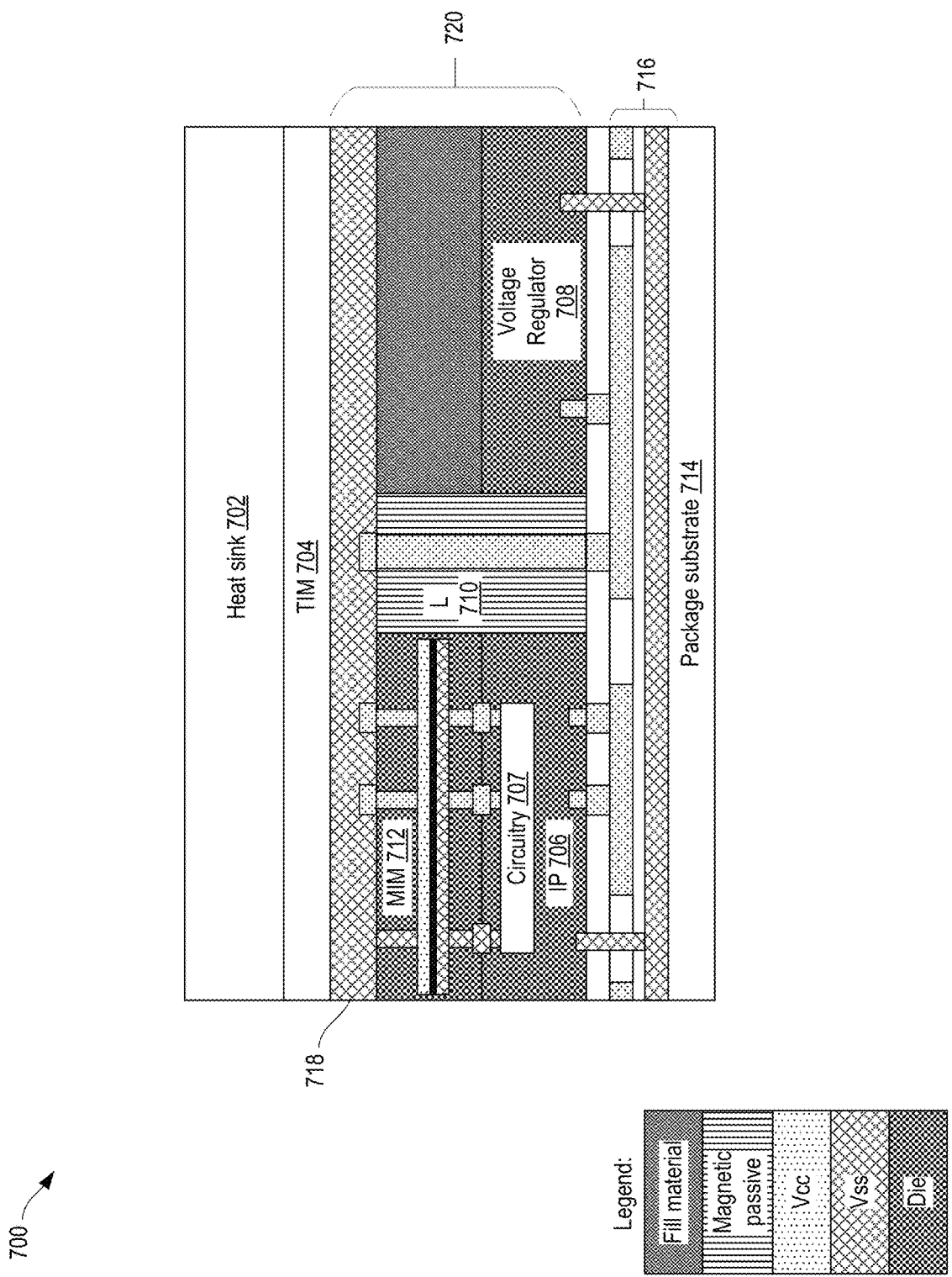
FIG. 7 illustrates another example system that includes a conformal power delivery structure on the backside of a stacked die architecture in accordance with embodiments of the present disclosure.
Figure 8:
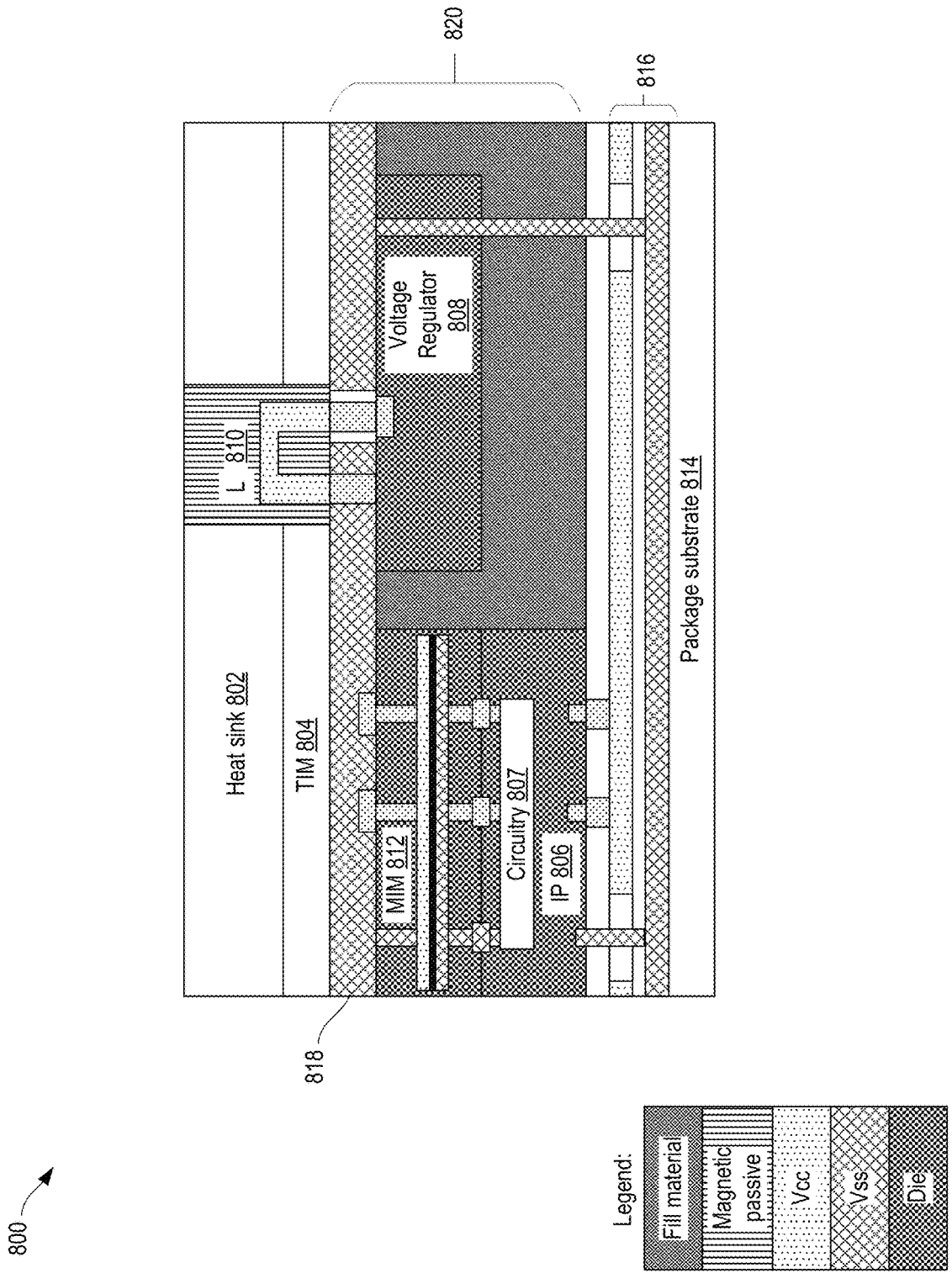
FIG. 8 illustrates another example system that includes a conformal power delivery structure on the backside of a stacked die architecture in accordance with embodiments of the present disclosure.

In the examples shown in FIGS. 2-3, the power planes form rectangular shapes which conform with one another. That is, the bottom power planes 202, 302 are formed with rectangular etched areas (and protrusions 203) in which the top power planes 204, 304 are formed. However, the etched areas and/or protrusions may be formed with other shapes. FIGS. 7-8 illustrate other examples shapes for such areas of a conformal power delivery structure.

FIG. 4 illustrates an example system 400 that includes a conformal power delivery structure 418 on the backside of a stacked die architecture 420 in accordance with embodiments of the present disclosure. As used herein, the "backside" may refer to the side or surface of a die/architecture that is opposite of a package substrate (or intended to be positioned opposite of a package substrate when placed on the substrate). For instance, in the example shown in FIG. 4, the conformal power delivery structure 418 is on the opposite side of the die architecture 420 than the side of the die architecture 420 that is to interface with the package substrate 414.

It will be understood that the example system 400 is illustrated in a simplified manner to show aspects of the present disclosure, and the system 400 may include additional, fewer, or different components than those illustrated. For example, the inductor 410 and capacitor 412 are shown with simplified conductive elements inside them; however, such elements may include a more complex components, materials, etc., such as, for example, spiral or coaxial windings or interleaved planes, etc. As another example, the package substrate 414 may be include an organic or ceramic printed circuit board (PCB) with relatively coarse and thicker conductive material than the dies, which may include finer features. The package substrate 414 can be made of multiple build-up layers with or without core layers, in some embodiments. In the example shown, the package substrate 414 connects to a main circuit board 430 (e.g., a motherboard or similar type of circuit board).

The example system 400 includes a package substrate 414 that has a parallel power plane structure 416 formed therein. The parallel power plane structure 416 includes a Vcc plane and a Vss plane as shown. The conformal power delivery structure 418 on the backside of the stacked die architecture 420 also includes a Vcc plane and a Vss plane as shown. The conformal power delivery structure 418 may be formed in a similar manner to the examples described above with respect to FIGS. 1-3, i.e., it may include a first metal layer and second metal layer deposited on the first metal layer such that it conforms with the shape of the first metal layer, with the two metal layers being separated by a thin dielectric layer. The example system 400 also includes a thermal interface material (TIM) 404 formed on top of the stacked die architecture 420, and a heat sink 402 formed on the TIM 404. The TIM 404 and heat sink 402 may act to dissipate heat from the stacked die architecture 420. The TIM 404 may include any general thermal interface material, such as liquid metal or thermal paste.

The stacked die architecture 420 includes two stacked intellectual property (IP) dies 406 (with 406A being above 406B in the architecture), a voltage regulator (VR) 408, an inductor 410 above the VR 408, and a capacitor 412 between the IP dies 406 and the VR 408. Each of the IP dies 406 includes circuitry 407 for implementing one or more functions of the IP die. The circuitry 407 may include transistors, digital logic circuits, etc., and may sometimes be referred to as "active circuitry" or "active components" or "actives" in the architecture (whereas the inductor 410 and capacitor 412 may be referred to as "passive components" or "passives" in the architecture). The VR 408 may receive an input voltage from the package substrate (not shown) and convert, filter, or otherwise manipulate the input voltage received to produce a voltage for use by the circuitries 407 of the IP dies 406, or by other components of the stacked die architecture 420. The voltage output by the VR 408 may be first passed through the inductor 410 and capacitor 412 before being provided to the IP dies 406.

In the example shown, the system 400 implements a buck VR architecture where the VR 408 provides its output voltage to the inductor 410, capacitor 412, and IP dies 406 via the conformal power delivery structure 418 at the top/backside of the stacked die architecture 420. In particular, the VR 408 provides its output voltage to the inductor 410, which is connected to the capacitor 412 through the conformal power delivery structure 418 (via the Vcc plane). The capacitor 412 is connected to the IP die 406A via the conformal power delivery structure 418 as well. In the example shown, the inductor 410 is effectively in series with the IP die 406A and the capacitor 412 is effectively in parallel with the IP die 406A. In this way, the conformal power delivery structure 418 effectively acts as the output power plane for the VR 408.

In some embodiments, the IP die 406B may also be powered by the VR 408 in a similar manner. For example, the VR 408 may provide power to the circuitry 407B of the IP die 406 by connecting to the inductor 410 and capacitor 412 through the conformal power delivery structure 418, and then to the IP die 406B through the parallel power plane structure 416 in the package substrate 414.

Figure 5:
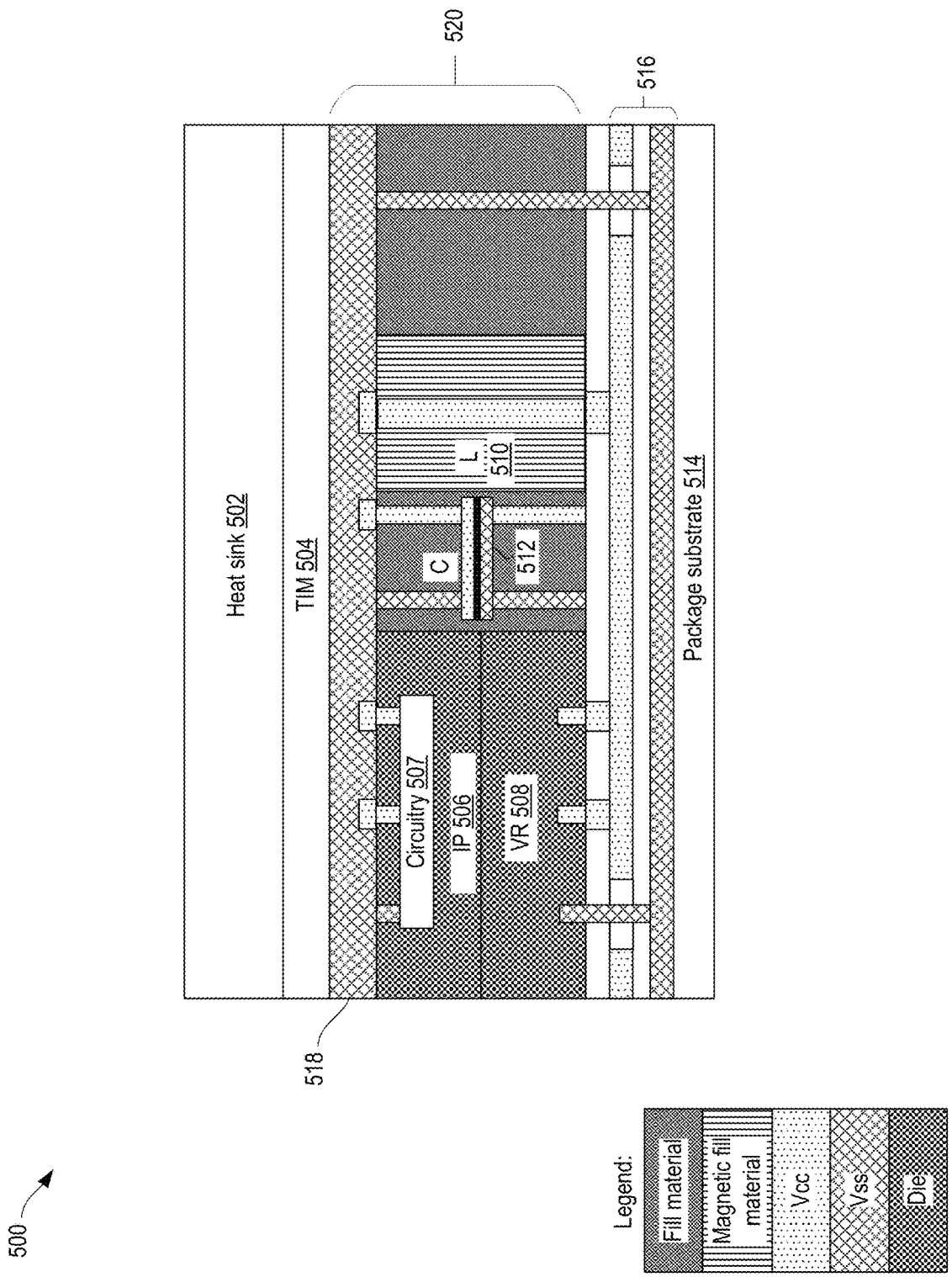
FIG. 5 illustrates another example system that includes a conformal power delivery structure on the backside of a stacked die architecture in accordance with embodiments of the present disclosure.

FIG. 5 illustrates another example system 500 that includes a conformal power delivery structure 518 on the backside of a stacked die architecture 520 in accordance with embodiments of the present disclosure. The example system 500 is configured in a similar manner as described above with respect to the system 400 except as described below. Although not shown, it will be understood that the system 500 may connect to a main circuit board (e.g., a motherboard) in a similar manner to the system 400 of FIG. 4.

In the example system 500, the power delivery path of the VR 508 uses both the parallel power plane structure 516 in the package substrate 514 and the conformal power delivery structure 518 on the backside of the stacked die architecture 520. The architecture shown in FIG. 5 may allow for a stacked configuration of the IP die 506 and the VR 508, while the passives (inductor 510 and capacitor 512) can be placed inside the layers of the stacked die architecture 520. By using the conformal power delivery structure 518 as shown, the need for through silicon/system vias (TSVs) to be used for power delivery may be reduced or eliminated, and TSVs could be used for other purposes, such as for input/output (IO) signaling, etc. It will be understood that the orientations of the VR 508 and IP die 506 can be flipped in other embodiments.

As above, the voltage output by the VR 508 may be first passed through the inductor 510 and capacitor 512 before being provided to the IP die 506. In particular, in the example shown, the VR 508 provides its output voltage to the inductor 510 via the parallel power plane structure 516, and then the power is passed to capacitor 512 and IP die 506 via the conformal power delivery structure 518 at the top/backside of the stacked die architecture 520. In the example shown, the inductor 510 is again effectively in series with the IP die 506 and the capacitor 512 is effectively in parallel with the IP die 506.

Figure 6:
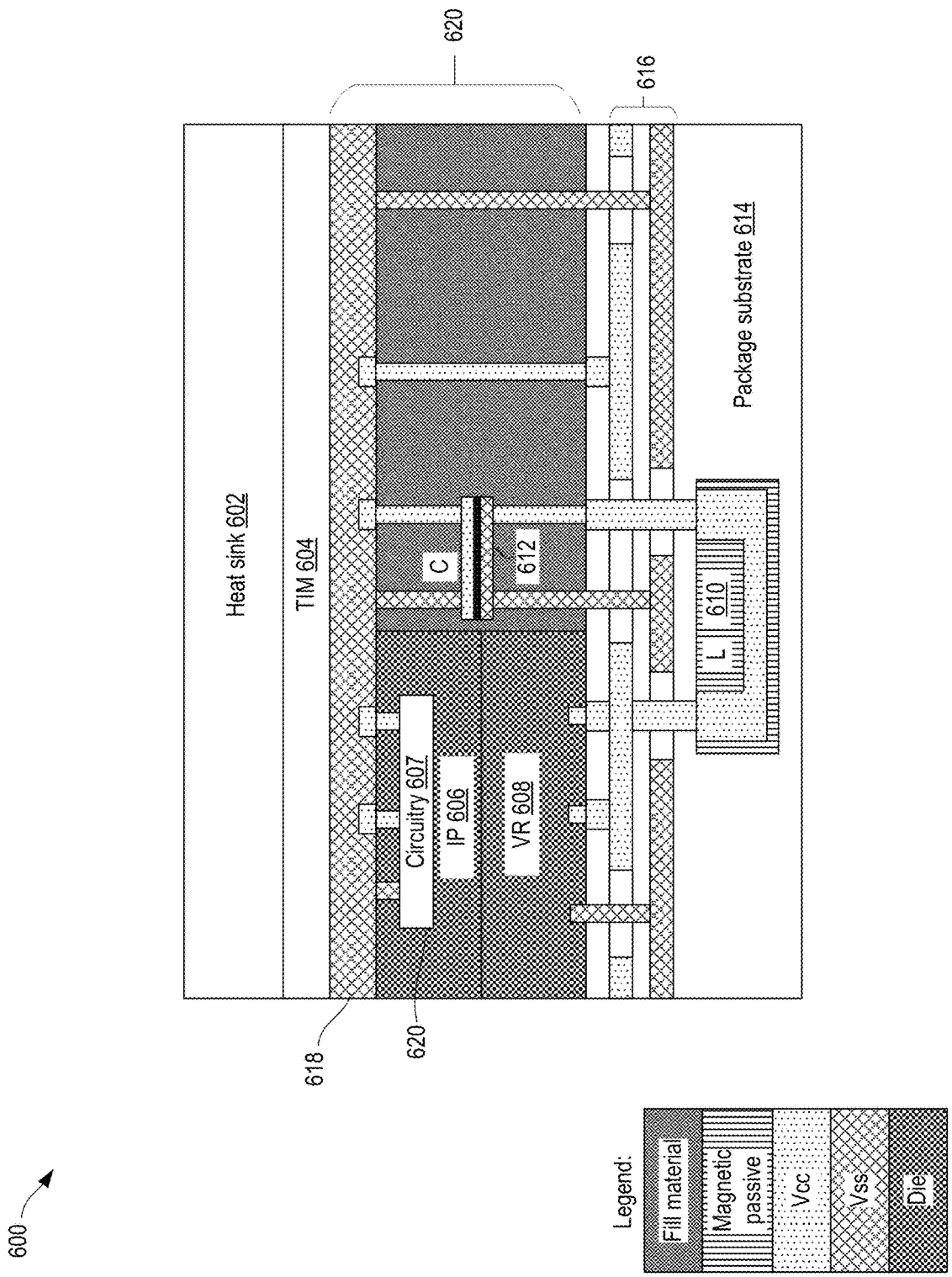
FIG. 6 illustrates another example system that includes a conformal power delivery structure on the backside of a stacked die architecture in accordance with embodiments of the present disclosure.

FIG. 6 illustrates another example system 600 that includes a conformal power delivery structure 618 on the backside of a stacked die architecture 620 in accordance with embodiments of the present disclosure. The example system 600 is configured in a similar manner as described above with respect to the system 400 except as described below. Although not shown, it will be understood that the system 600 may connect to a main circuit board (e.g., a motherboard) in a similar manner to the system 400 of FIG. 4.

The example system 600 includes a stacked configuration of the IP die 606 and the VR 608 as in FIG. 5, but with the inductor 610 being embedded in the package substrate 614 (e.g., as an in-package fabricated inductor, such as Coax-MIL). The capacitor 612 is within the layers of the stacked die architecture 620 as before. In the example configuration shown, the VR 608 provides its output voltage to the inductor 610 via the parallel power plane structure 616 in the package substrate 614, and then the power is passed to capacitor 612 in the layers of the stacked die architecture 620, and then to the IP die 606 via the conformal power delivery structure 618 at the top/backside of the stacked die architecture 620. In the example shown, the inductor 610 is again effectively in series with the IP die 606 and capacitor 612 is effectively in parallel with the IP die 606.

FIG. 7 illustrates another example system 700 that includes a conformal power delivery structure 718 on the backside of a stacked die architecture 720 in accordance with embodiments of the present disclosure. The example system 700 is configured in a similar manner as described above with respect to the system 400 except as described below. Although not shown, it will be understood that the system 700 may connect to a main circuit board (e.g., a motherboard) in a similar manner to the system 400 of FIG. 4.

In the example shown, the VR 708 provides its output voltage to the inductor 710 (which is inside the layers of the stacked die architecture 720) via the parallel power plane structure 716 in the package substrate 714. The power is then passed to a die 712 that includes a metal-in-metal (MIM) capacitor die 712 via the conformal power delivery structure 718 at the top/backside of the stacked die architecture 720. The power then passes to the IP die 706 under the MIM capacitor die 712 through vias or another type of die-to-die connection between the dies 712, 706. In the example shown, the inductor 710 is again effectively in series with the IP die 706 and the capacitor 712 is effectively in parallel with the IP die 706. The IP die 706 may also have additional connections to the parallel power plane structure 716 as shown.

In some embodiments, the IP die orientation can be flipped to deliver the power to the circuitry 707 through the underside/bottom of the IP die. Also, the positions of the MIM capacitor die 712 and the IP die 706 can be interchanged as well, in certain embodiments.

FIG. 8 illustrates another example system 800 that includes a conformal power delivery structure 818 on the backside of a stacked die architecture 820 in accordance with embodiments of the present disclosure. The example system 800 is configured in a similar manner as described above with respect to the system 400 except as described below. Although not shown, it will be understood that the system 800 may connect to a main circuit board (e.g., a motherboard) in a similar manner to the system 400 of FIG. 4. In particular, the system 800 is a variant of the system 700 described above, but with the inductor 810 embedded inside the heat sink 802 and TIM 804, above the conformal power delivery structure 816. Such a configuration may allow for more flexibility in inductor components that can be used. Although shown as being placed within a fully bored out hole inside the heat sink 802, it will be understood that the inductor 810 may be only partially within the heat sink 802 (e.g., not accessible from above the heat sink 802 as is shown) in other embodiments.

Figure 9:
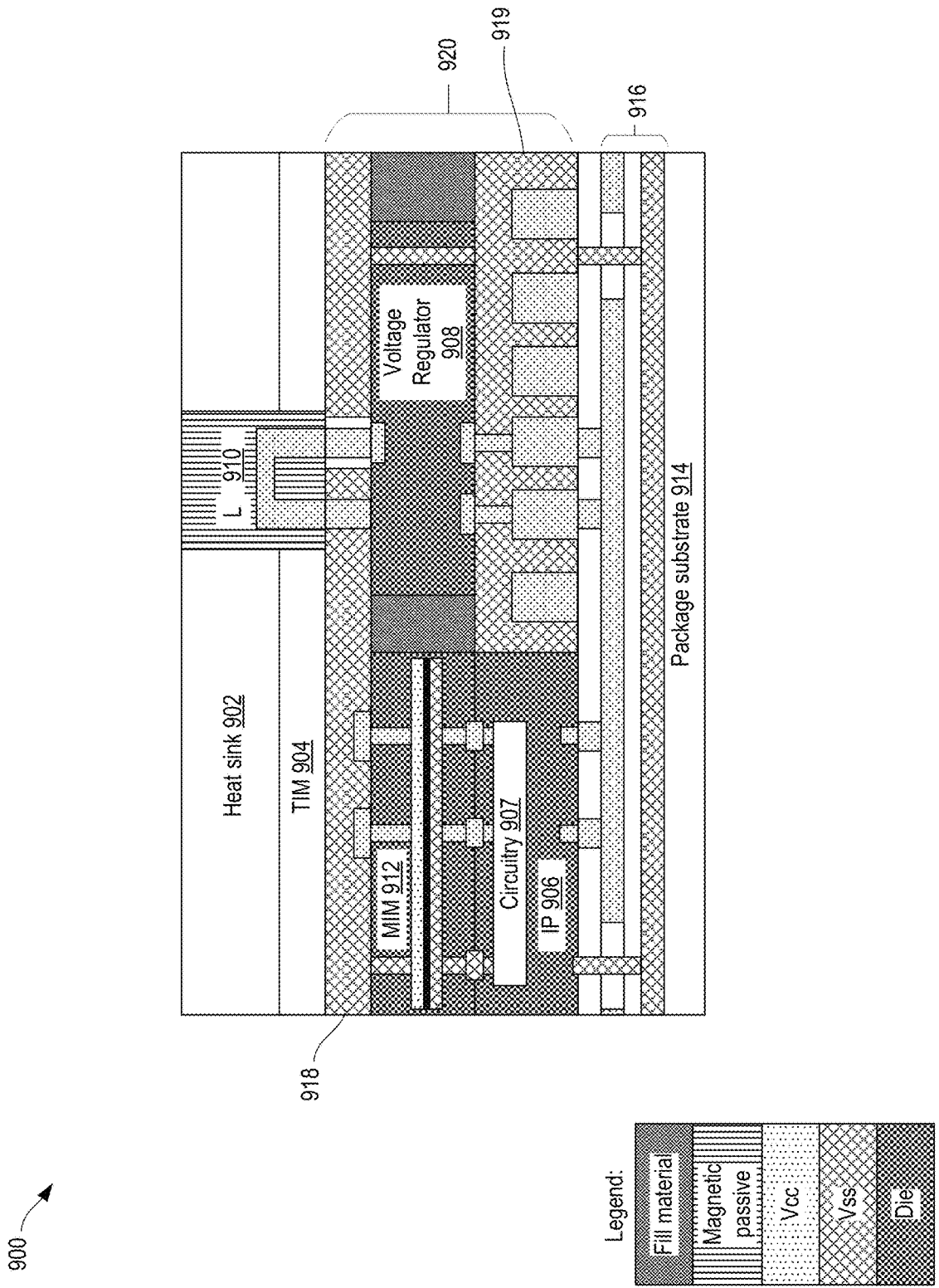
FIG. 9 illustrates another example system that includes a conformal power delivery structure on the backside of a stacked die architecture in accordance with embodiments of the present disclosure.

FIG. 9 illustrates another example system 900 that includes a conformal power delivery structure 918 on the backside of a stacked die architecture 920 in accordance with embodiments of the present disclosure. The example system 900 is configured in a similar manner as described above with respect to the system 800 but includes an additional conformal power delivery structure 619 within the layers of the stacked die architecture 920 as shown. Such a configuration may improve the power delivery quality throughout the stacked die architecture 920, in all directions. For instance, in the example shown, the input power delivery to the VR 908 may be improved as compared with other configurations. Although not shown, it will be understood that the system 900 may connect to a main circuit board (e.g., a motherboard) in a similar manner to the system 400 of FIG. 4.

Figure 10:
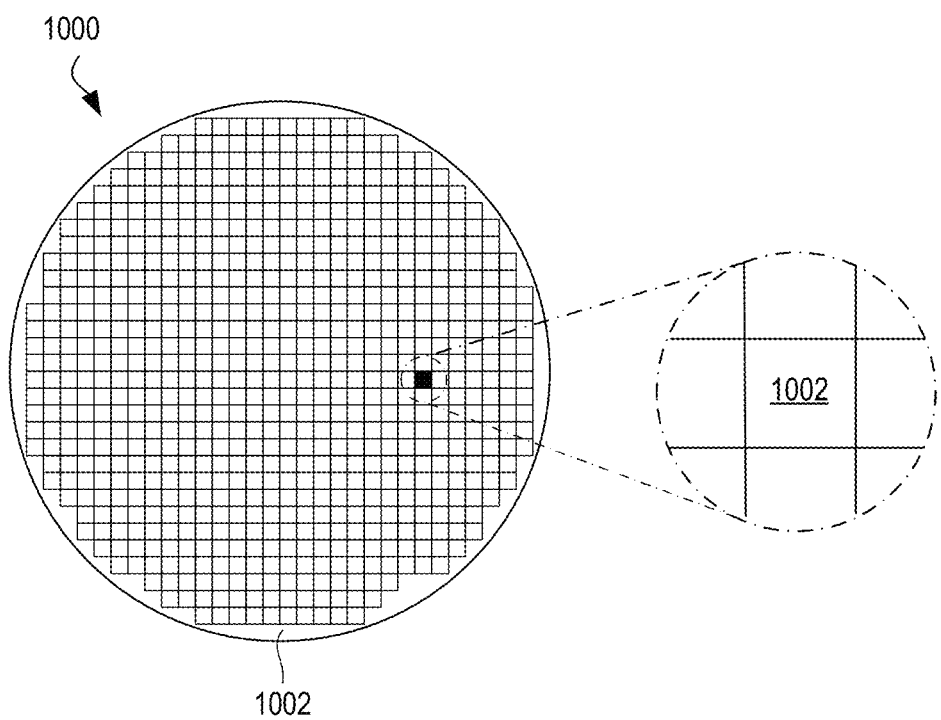
FIG. 10 is a top view of a wafer and dies that may be included in a microelectronic assembly, in accordance with any of the embodiments disclosed herein.

FIG. 10 is a top view of a wafer 1000 and dies 1002 that may include any of the stacked die architectures with conformal power delivery structures as disclosed herein. The wafer 1000 may be composed of semiconductor material and may include one or more dies 1002 having integrated circuit structures formed on a surface of the wafer

1000. The individual dies 1002 may be a repeating unit of an integrated circuit product that includes any suitable integrated circuit. After the fabrication of the semiconductor product is complete, the wafer 1000 may undergo a singulation process in which the dies 1002 are separated from one another to provide discrete "chips" of the integrated circuit product. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAIVI) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processor unit (e.g., the processor unit 1302 of FIG. 13) or other logic that is configured to store information in the memory devices or execute instructions stored in the memory array. Various embodiments disclosed herein may be manufactured using a die-to-wafer assembly technique in which some dies are attached to a wafer 1000 that include others of the dies, and the wafer 1000 is subsequently singulated.

Figure 11:
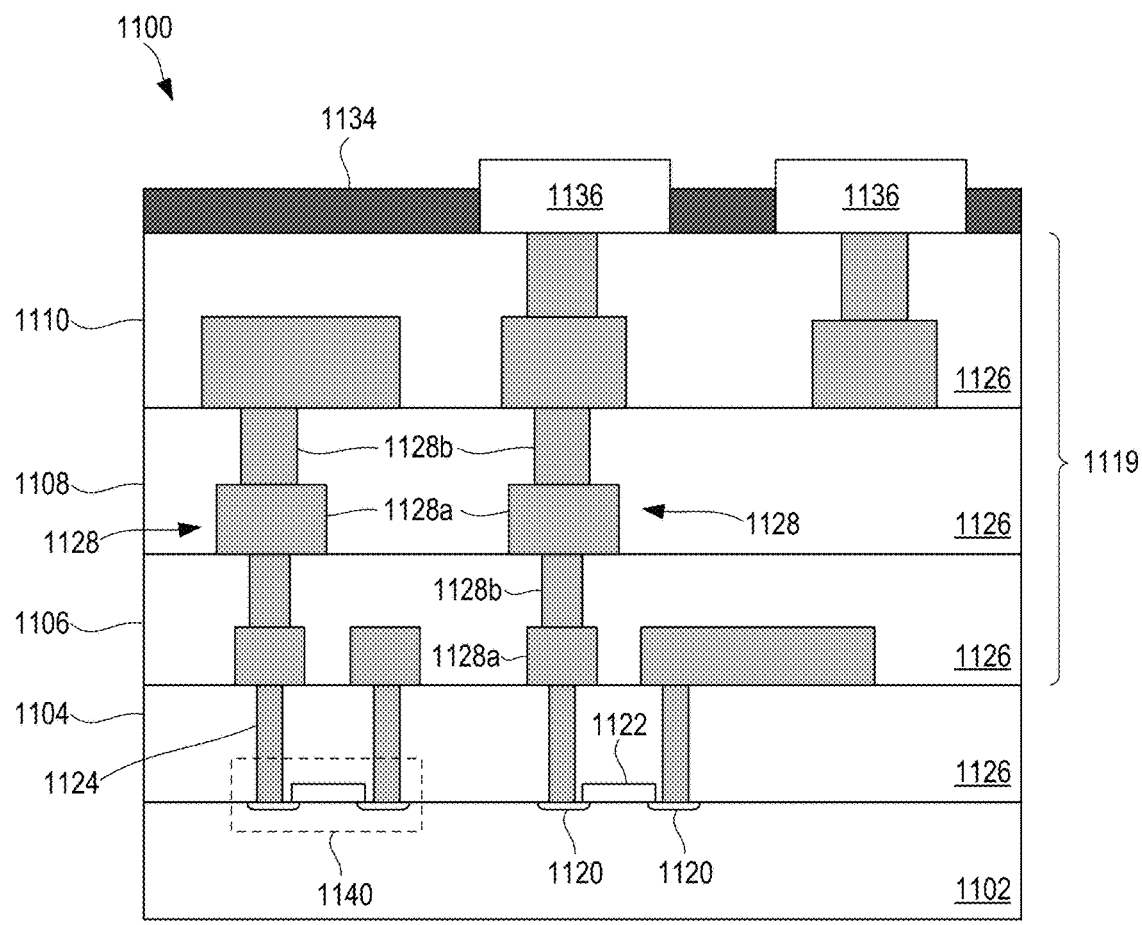
FIG. 11 is a cross-sectional side view of an integrated circuit device that may be included in a microelectronic assembly, in accordance with any of the embodiments disclosed herein.

FIG. 11 is a cross-sectional side view of an integrated circuit device 1100 that may include any of the stacked die architectures with conformal power delivery structures as disclosed herein. One or more of the integrated circuit devices 1100 may be included in one or more dies 1002 (FIG. 10). The integrated circuit device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit device 1100 may be used. The die substrate 1102 may be part of a singulated die (e.g., the dies 1002 of FIG. 10) or a wafer (e.g., the wafer 1000 of FIG. 10).

The integrated circuit device 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit device 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuit devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the die substrate 1102 upon which the device layer 1104 is formed. For example, the lines 1128a may route electrical signals in a direction in and out of the page and/or in a direction across the page from the perspective of FIG. 13. The vias 1128b may be arranged to route electrical signals in a direction of a plane that is substantially perpendicular to the surface of the die substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 11. In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104. The vias 1128b of the first interconnect layer 1106 may be coupled with the lines 1128a of a second interconnect layer 1108.

The second interconnect layer 1108 (referred to as Metal 2 or "M2") may be formed directly on the first interconnect layer 1106. In some embodiments, the second interconnect layer 1108 may include via 1128b to couple the lines 1128 of the second interconnect layer 1108 with the lines 1128a of a third interconnect layer 1110. Although the lines 1128a and the vias 1128b are structurally delineated with a line within individual interconnect layers for the sake of clarity, the lines 1128a and the vias 1128b may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit device 1100 (i.e., farther away from the device layer 1104) may be thicker that the interconnect layers that are lower in the metallization stack 1119, with lines 1128a and vias 1128b in the higher interconnect layers being thicker than those in the lower interconnect layers.

The integrated circuit device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit device 1100 with another component (e.g., a printed circuit board). The integrated circuit device 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit device 1100 is a double-sided die, the integrated circuit device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the integrated circuit device 1100 from the conductive contacts 1136.

In other embodiments in which the integrated circuit device 1100 is a double-sided die, the integrated circuit device 1100 may include one or more through silicon vias (TSVs) through the die substrate 1102; these TSVs may make contact with the device layer(s) 1104, and may provide conductive pathways between the device layer(s) 1104 and additional conductive contacts (not shown) on the opposite side of the integrated circuit device 1100 from the conductive contacts 1136. In some embodiments, TSVs extending through the substrate can be used for routing power and ground signals from conductive contacts on the opposite side of the integrated circuit device 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuit devices 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 12:
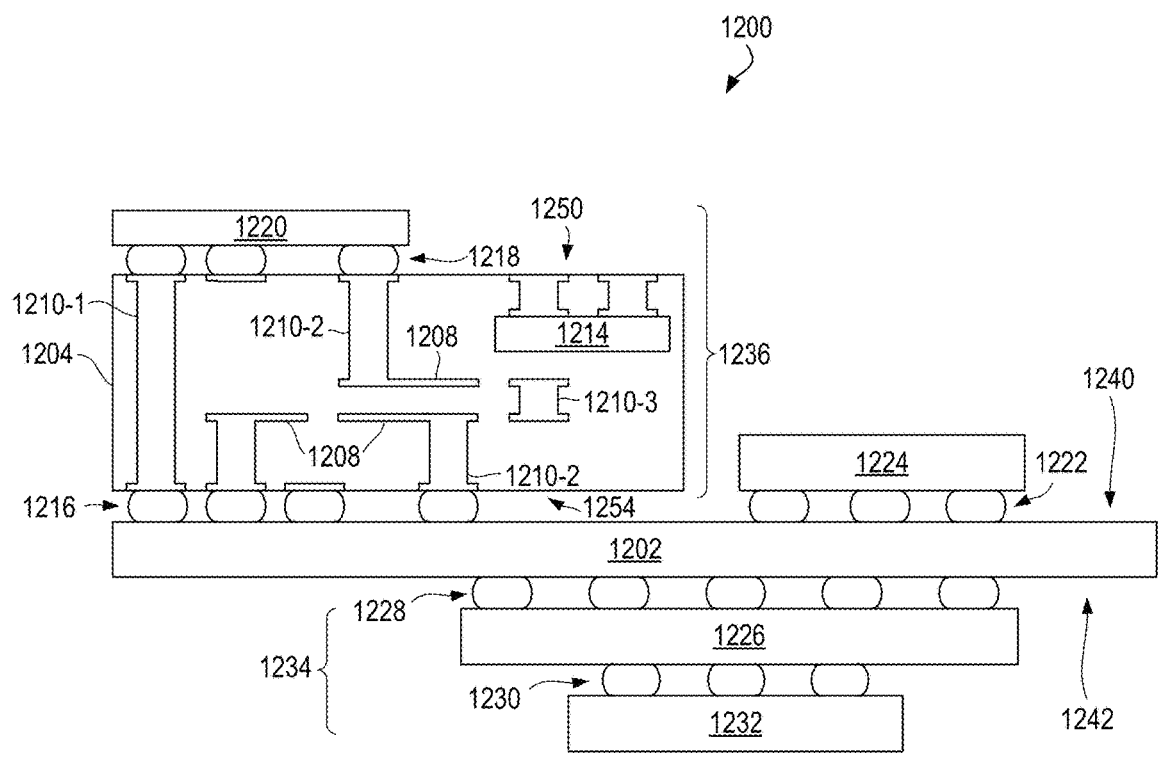
FIG. 12 is a cross-sectional side view of an integrated circuit device assembly that may include a microelectronic assembly, in accordance with any of the embodiments disclosed herein.

FIG. 12 is a cross-sectional side view of an integrated circuit device assembly 1200 that may include any of the stacked die architectures with conformal power delivery structures disclosed herein. In some embodiments, the integrated circuit device assembly 1200 may be a microelectronic assembly. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpacked integrated circuit product that includes one or more integrated circuit dies (e.g., the die 1002 of FIG. 10, the integrated circuit device 1100 of FIG. 11) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices In embodiments where the integrated circuit component 1220 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204. In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art. In embodiments where the interposer is a non-printed circuit board The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
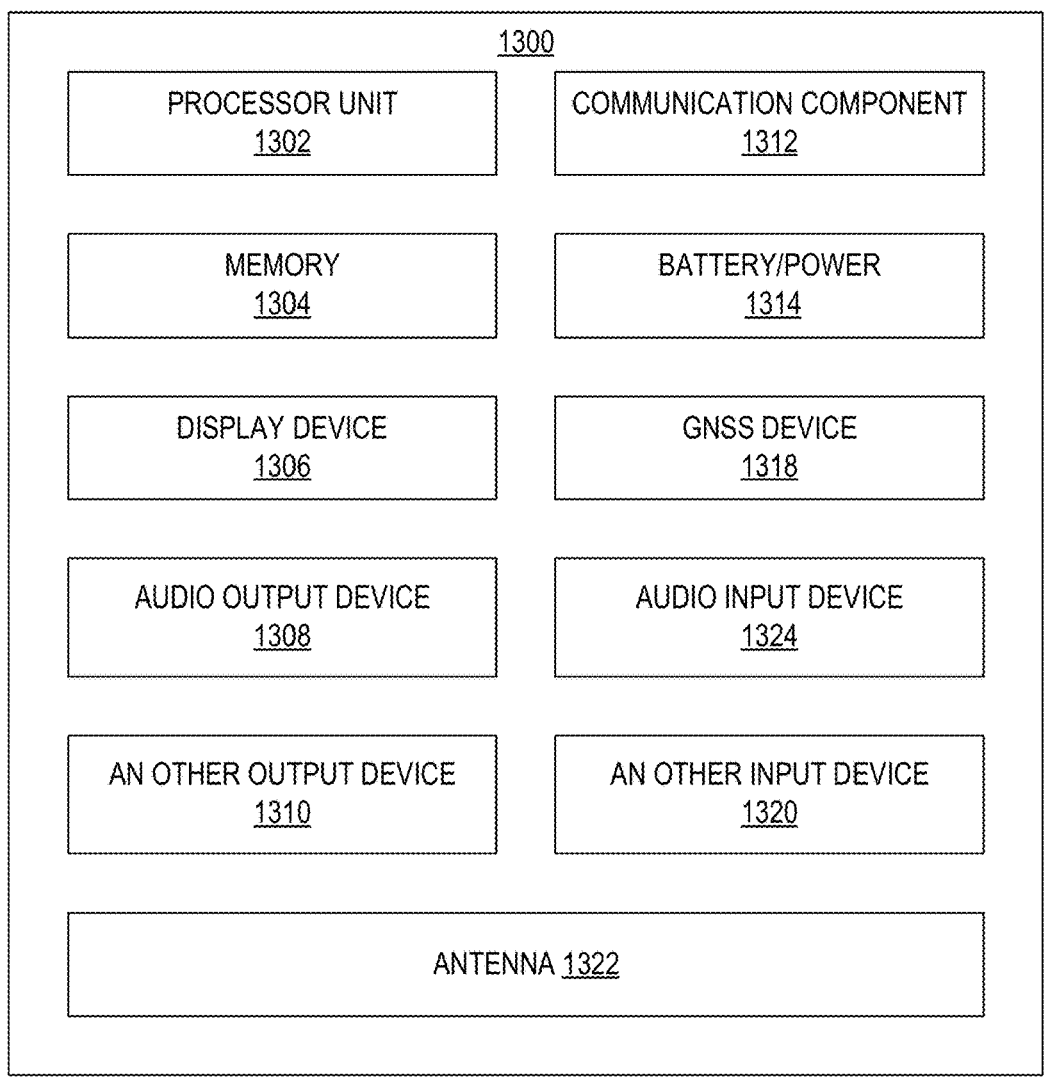
FIG. 13 is a block diagram of an example electrical device that may include a microelectronic assembly, in accordance with any of the embodiments disclosed herein.

FIG. 13 is a block diagram of an example electrical device 1300 that may include one or more of the stacked die architectures with conformal power delivery structures as disclosed herein. For example, any suitable ones of the components of the electrical device 1300 may include one or more of the integrated circuit device assemblies 1200, integrated circuit components 1220, integrated circuit devices 1100, or integrated circuit dies 1002 disclosed herein. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, micro-architectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include an other output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include an other input device 1320 (or corresponding interface circuitry, as discussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes a stacked die apparatus comprising: a first die comprising voltage regulator circuitry; a second die comprising logic circuitry; an inductor; a capacitor; and a conformal power delivery structure, the conformal power delivery structure comprising: a first electrically conductive layer comprising metal, the first electrically conductive layer defining one or more recesses; a second electrically conductive layer comprising metal, the second electrically conductive layer at least partially within the recesses of the first electrically conductive layer and having a lower surface that generally conforms with the upper surface of the first electrically conductive layer; and a dielectric material between the surfaces of the first electrically conductive layer and the second electrically conductive layer that conform with one another; wherein the voltage regulator circuitry of the first die is connected to the logic circuitry of the second die through the inductor, the capacitor, and the conformal power delivery structure.

Example 2 includes the subject matter of Example 1, further comprising a third die comprising logic circuitry, wherein the voltage regulator circuitry of the first die is connected to the logic circuitry of the third die through the inductor, capacitor, and conformal power delivery structure.

Example 3 includes the subject matter of Example 1 or 2, further comprising a third die, wherein the capacitor is a metal-in-metal capacitor within the third die.

Example 4 includes the subject matter of Example 3, wherein the third die is above the second die in the stacked die architecture.

Example 5 includes the subject matter of Example 1 or 2, wherein the capacitor is within a fill material of the stacked die apparatus.

Example 6 includes the subject matter of any one of Examples 1-5, wherein the inductor is in series with the logic circuitry of the second die and the capacitor is in parallel with the logic circuitry of the second die.

Example 7 includes the subject matter of any one of Examples 1-6, wherein the voltage regulator circuitry of the first die comprises circuitry to receive an input voltage signal and provide an output voltage to the inductor, capacitor, and the logic circuitry of the first die, wherein the circuitry is to generate the output voltage based on the input voltage.

Example 8 includes the subject matter of any one of Examples 1-7, wherein the conformal power delivery structure is on an upper surface of the stacked die apparatus.

Example 9 includes the subject matter of any one of Examples 1-8, wherein the conformal power delivery structure is a first conformal power delivery structure, and the apparatus further comprises a second conformal power delivery structure within the stacked die apparatus, the second conformal power delivery structure comprising: a third electrically conductive layer comprising metal, the third electrically conductive layer defining one or more recesses; a fourth electrically conductive layer comprising metal, the fourth electrically conductive layer at least partially within the recesses of the third electrically conductive layer and having a lower surface that generally conforms with the upper surface of the third electrically conductive layer; and a dielectric material between the surfaces of the third electrically conductive layer and the fourth electrically conductive layer that conform with one another.

Example 10 includes a system comprising: a package substrate comprising a power plane structure; and a stacked die apparatus connected to the package substrate, the stacked die apparatus comprising: a first die comprising voltage regulator circuitry, the voltage regulator circuitry comprising circuitry to receive an input from the package substrate and provide an output based on the input; a second die comprising logic circuitry; a conformal power delivery structure on a surface of the stacked die apparatus opposite the package substrate, the conformal power delivery structure comprising: a first electrically conductive layer comprising metal, the first electrically conductive layer defining one or more recesses; a second electrically conductive layer comprising metal, the second electrically conductive layer at least partially within the recesses of the first electrically conductive layer and having a lower surface that generally conforms with the upper surface of the first electrically conductive layer; and a dielectric material between the surfaces of the first electrically conductive layer and the second electrically conductive layer that conform with one another; an inductor connected to the output voltage regulator circuitry; a capacitor connected to the inductor and the logic circuitry of the second die; and a thermal interface material layer on the conformal power delivery structure of the stacked die apparatus; and a heat sink on the thermal interface material; wherein the conformal power delivery structure connected to at least one of the voltage regulator circuitry, the inductor, the capacitor, and the logic circuitry.

Example 11 includes the subject matter of Example 10, wherein the power plane structure of the package substrate comprises a parallel power plane structure.

Example 12 includes the subject matter of Example 10, wherein the conformal power delivery structure is a first conformal power delivery structure, and the power plane structure of the package substrate comprises a second conformal power delivery structure comprising: a third electrically conductive layer comprising metal, the third electrically conductive layer defining one or more recesses; a fourth electrically conductive layer comprising metal, the fourth electrically conductive layer at least partially within the recesses of the third electrically conductive layer and having a lower surface that generally conforms with the upper surface of the third electrically conductive layer; and a dielectric material between the surfaces of the third electrically conductive layer and the fourth electrically conductive layer that conform with one another.

Example 13 includes the subject matter of any one of Examples 10-12, wherein the voltage regulator circuitry of the first die is further connected to the logic circuitry of the second die through the power plane structure of the package substrate.

Example 14 includes the subject matter of Example 13, wherein the first die is below the second die in the stacked die apparatus.

Example 15 includes the subject matter of any one of Examples 10-14, wherein the inductor is at least partially within the heat sink.

Example 16 includes the subject matter of any one of Examples 10-14, wherein the inductor is at least partially within the package substrate.

Example 17 includes the subject matter of any one of Examples 10-16, wherein the inductor is in series with the logic circuitry of the second die and the capacitor is in parallel with the logic circuitry of the second die.

Example 18 includes the subject matter of any one of Examples 10-17, wherein the capacitor is within a fill material of the stacked die apparatus.

Example 19 includes the subject matter of any one of Examples 10-18, wherein the stacked die apparatus further comprises a third die, and the capacitor is within the third die.

Example 20 includes the subject matter of any one of Examples 10-19, further comprising a circuit board connected to the package substrate.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. A stacked die apparatus comprising:
a first die comprising voltage regulator circuitry;
a second die comprising logic circuitry;
an inductor;
a capacitor; and
a conformal power delivery structure, the conformal power delivery structure comprising:
a first electrically conductive layer comprising metal, the first electrically conductive layer defining one or more recesses;
a second electrically conductive layer comprising metal, the second electrically conductive layer at least partially within the recesses of the first electrically conductive layer and having a lower surface that generally conforms with the upper surface of the first electrically conductive layer; and
a dielectric material between the surfaces of the first electrically conductive layer and the second electrically conductive layer that conform with one another;
wherein the voltage regulator circuitry of the first die is connected to the logic circuitry of the second die through the inductor, the capacitor, and the conformal power delivery structure.

2. The apparatus of claim 1, further comprising a third die comprising logic circuitry, wherein the voltage regulator circuitry of the first die is connected to the logic circuitry of the third die through the inductor, capacitor, and conformal power delivery structure.

3. The apparatus of claim 1, further comprising a third die, wherein the capacitor is a metal-in-metal capacitor within the third die.

4. The apparatus of claim 3, wherein the third die is above the second die in the stacked die architecture.

5. The apparatus of claim 1, wherein the capacitor is within a fill material of the stacked die apparatus.

6. The apparatus of claim 1, wherein the inductor is in series with the logic circuitry of the second die and the capacitor is in parallel with the logic circuitry of the second die.

7. The apparatus of claim 1, wherein the voltage regulator circuitry of the first die comprises circuitry to receive an input voltage signal and provide an output voltage to the inductor, capacitor, and the logic circuitry of the first die, wherein the circuitry is to generate the output voltage based on the input voltage.

8. The apparatus of claim 1, wherein the conformal power delivery structure is on an upper surface of the stacked die apparatus.

9. The apparatus of claim 1, wherein the conformal power delivery structure is a first conformal power delivery structure, and the apparatus further comprises a second conformal power delivery structure within the stacked die apparatus, the second conformal power delivery structure comprising:
a third electrically conductive layer comprising metal, the third electrically conductive layer defining one or more recesses;
a fourth electrically conductive layer comprising metal, the fourth electrically conductive layer at least partially within the recesses of the third electrically conductive layer and having a lower surface that generally conforms with the upper surface of the third electrically conductive layer; and
a dielectric material between the surfaces of the third electrically conductive layer and the fourth electrically conductive layer that conform with one another.

10. A system comprising:
a package substrate comprising a power plane structure; and a stacked die apparatus connected to the package substrate, the stacked die apparatus comprising:
- a first die comprising voltage regulator circuitry, the voltage regulator circuitry comprising circuitry to receive an input from the package substrate and provide an output based on the input;
- a second die comprising logic circuitry;
- a conformal power delivery structure on a surface of the stacked die apparatus opposite the package substrate, the conformal power delivery structure comprising:
  - a first electrically conductive layer comprising metal, the first electrically conductive layer defining one or more recesses;
  - a second electrically conductive layer comprising metal, the second electrically conductive layer at least partially within the recesses of the first electrically conductive layer and having a lower surface that generally conforms with the upper surface of the first electrically conductive layer; and
  - a dielectric material between the surfaces of the first electrically conductive layer and the second electrically conductive layer that conform with one another;
- an inductor connected to the output voltage regulator circuitry;
- a capacitor connected to the inductor and the logic circuitry of the second die; and
- a thermal interface material layer on the conformal power delivery structure of the stacked die apparatus; and
- a heat sink on the thermal interface material;
- wherein the conformal power delivery structure connected to at least one of the voltage regulator circuitry, the inductor, the capacitor, and the logic circuitry.

11. The system of claim 10, wherein the power plane structure of the package substrate comprises a parallel power plane structure.

12. The system of claim 10, wherein the conformal power delivery structure is a first conformal power delivery structure, and the power plane structure of the package substrate comprises a second conformal power delivery structure comprising:
- a third electrically conductive layer comprising metal, the third electrically conductive layer defining one or more recesses;
- a fourth electrically conductive layer comprising metal, the fourth electrically conductive layer at least partially within the recesses of the third electrically conductive layer and having a lower surface that generally conforms with the upper surface of the third electrically conductive layer; and
- a dielectric material between the surfaces of the third electrically conductive layer and the fourth electrically conductive layer that conform with one another.

13. The system of claim 10, wherein the voltage regulator circuitry of the first die is further connected to the logic circuitry of the second die through the power plane structure of the package substrate.

14. The system of claim 13, wherein the first die is below the second die in the stacked die apparatus.

15. The system of claim 10, wherein the inductor is at least partially within the heat sink.

16. The system of claim 10, wherein the inductor is at least partially within the package substrate.

17. The system of claim 10, wherein the inductor is in series with the logic circuitry of the second die and the capacitor is in parallel with the logic circuitry of the second die.

18. The system of claim 10, wherein the capacitor is within a fill material of the stacked die apparatus.

19. The system of claim 10, wherein the stacked die apparatus further comprises a third die, and the capacitor is within the third die.

20. The system of claim 10, further comprising a circuit board connected to the package substrate.

* * * * *